June 19, 1928.

A. J. VASSELLI

AUTOMATIC RADIO STATION FINDER

Re. 17,002

Original Filed June 10, 1924

2 Sheets-Sheet 1

A. J. Vasselli.
INVENTOR.

By Louis M. Sanders
ATTORNEY.

June 19, 1928. A. J. VASSELLI Re. 17,002

AUTOMATIC RADIO STATION FINDER

Original Filed June 10, 1924 2 Sheets-Sheet 2

A. J. Vasselli
INVENTOR.

By Louis M. Sanders
ATTORNEY.

Reissued June 19, 1928. Re. 17,002

UNITED STATES PATENT OFFICE.

ANTHONY J. VASSELLI, OF NEWARK, NEW JERSEY, ASSIGNOR, BY MESNE ASSIGNMENTS, TO ZENITH RADIO CORPORATION, OF CHICAGO, ILLINOIS, A CORPORATION OF ILLINOIS.

AUTOMATIC RADIO STATION FINDER.

Original No. 1,581,145, dated April 20, 1926, Serial No. 719,123, filed June 10, 1924. Application for reissue filed April 14, 1928. Serial No. 270,066.

By common methods of operating radio receiving sets for the purpose of successively bringing in a series of broadcasting stations, it is necessary to separately manipulate the several tuning and regulating devices upon the panel for each separate station brought in. If the program being broadcasted by the particular station brought in for the time being is unsatisfactory, it becomes necessary to reset for some other station. This is always a time-consuming operation, and frequently portions of a desirable program are missed because of the time consumed in tuning in the particular station desired, in order to get the best reception possible.

It is the purpose of the present invention to provide an automatic setting mechanism, whereby each of the several tuning and adjusting devices mounted upon the panel may be automatically and simultaneously reset for any particular station desired. Provision is also made for a plurality of stations, so that the setting mechanism may be adjusted for each individual station and, once set for that station, may be returned to the proper position to bring in that station at will, without the necessity of returning each of the several instruments upon the panel separately.

It is found, in the operating of receiving sets, that when all of the several instruments are set and properly tuned to bring in a particular broadcasting station, a change in atmospheric or static conditions will require slight changes in the adjustment of the several instruments in order that clear and loud reception may be attained. Means are provided for such additional adjustment by leaving the adjusting elements exposed, so that they may be manipulated individually to obtain the best results after the particular station has been brought in.

In order that the device may be adapted to existing receiving sets, the structure has been designed in such a manner that the setting devices thereof may be shifted and reset to conform with the requirements of various receiving sets that are now on the market.

In carrying out the invention, use is made of the structure illustrated in the accompanying drawings.

Figure 1:
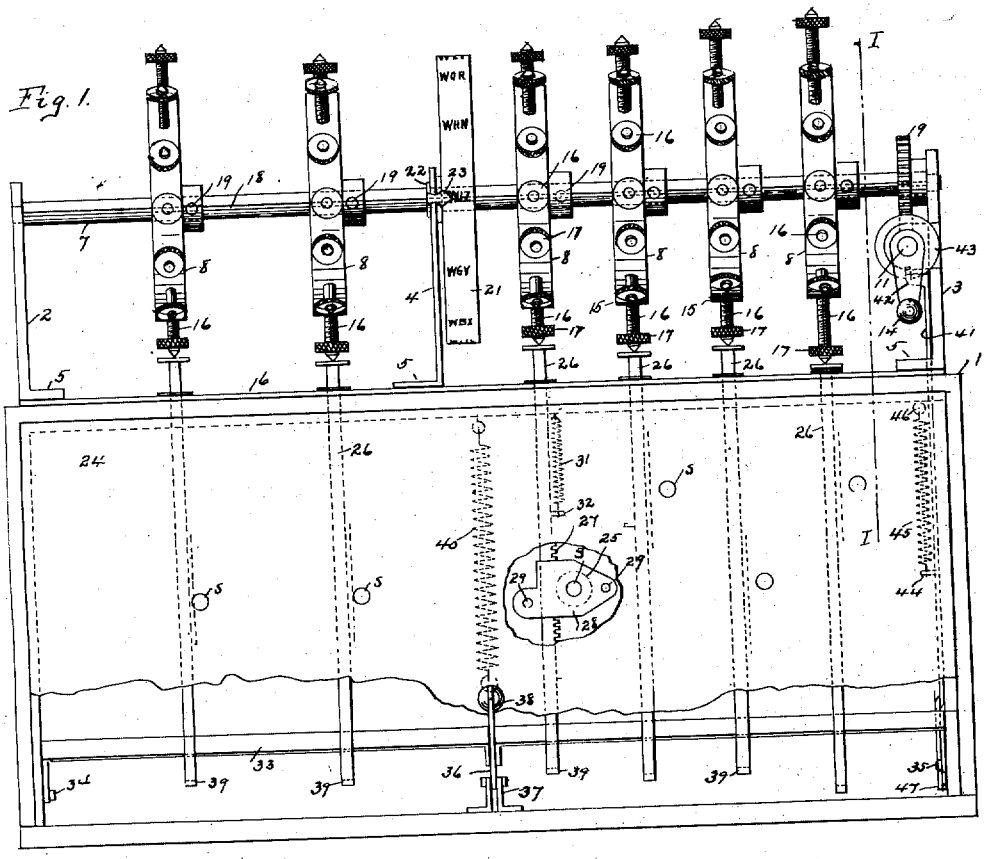
Fig. 1 is a front elevational view of the finder, showing a plurality of the setting devices in various adjusted positions to bring in different stations.

In Fig. 1 is shown a typical radio receiving cabinet 1 having a plurality of tuning and adjusting instruments mounted upon the panel, while on the top of this cabinet 1 is mounted the frame of the improved finder.

This frame consists of end standards 2 and 3 and a middle standard 4, all being substantially alike in general contour, with the exception that the standard 3 is provided with additional bearing brackets hereinafter to be fully described.

Each standard is provided with feet 5 by which it is secured to a base plate 6, secured to the top of the receiving cabinet. In the upper ends of the three standards 2, 3, and 4 is mounted a horizontal shaft 7, upon which several cup shaped disc wheels 8 are fixed.

At the right hand end of the shaft 7 is a worm wheel 9, in position to engage the worm 10 upon a horizontal crank shaft 11, which latter is mounted in bearing brackets 12 and 13 projecting inwardly and integral with the end standard 3, and on the end of shaft 11 is a crank 14 by which the shaft 7 may be rotated as above described.

The several discs 8 are all alike in structure and are made with a laterally projecting annular flange 15, in which are several adjusting screws 16, spaced apart at uniform intervals around the periphery of the flange and capable of lineal adjustment by means of their knurled heads 17. The shaft 7 is provided with a longitudinal groove 18 into which set screws 19 are inserted through the hubs of the several discs 8, so that all of the several adjusting screws 16 may be kept in register, and by which the several discs may be adjusted to correct positions along the shaft to bring them in proper alignment with the several tuning instruments within the cabinet.

At the middle of the shaft 7 and adjacent to the standard 4 is mounted a master or index drum 21, having printed upon its periphery the station letters of as many of the broadcasting stations as there are adjusting screws 16 in each of the several discs 8.

Upon the standard 4 is mounted a rigid pointer arm 22, which projects radially outward and has at its outer end an index pointer 23 in position to register with the stations indicated on the periphery of the drum 21. If the crank 14 is turned, its rotary movement will be communicated through the shaft 11, worm 10, and worm wheel 9 to the shaft 7, thereby causing the index drum 21 to rotate and bring the various station letters upon its periphery successively beneath the index pointer 23. The gear-ratio of the worm 10 and worm wheel 9 is such as to require a complete revolution of the crank 14 to produce an advance of one space indicated upon the drum 21.

The several devices used in connection with radio telephony, such as condensers, couplers, rheostats, etc., are usually mounted upon an insulating panel 24 and extend therefrom within the body of the cabinet.

The shafts for operating these several devices ordinarily project through the front face of the panel and are provided with index dials by which said devices are adjustably operated in the usual well known manner.

In order to adapt the invention to the operation of these several devices, there is upon each of their respective shafts S, a small pinion 25 (see Fig. 1), immediately inside of the panel 24. Extending through the plate 6, on the top of the cabinet and guided by it, is a long bar 26, having a rack 27 thereon in position to engage the pinion 25.

This rack is guided by and held in such engagement by a bracket 28, which is secured to the inner face of the panel 24 by means of screws 29. A part of the bracket is disposed around the bar 26 to form a guide therefor and hold the bar with its rack in engagement with the teeth of the pinion 25 as above indicated.

It should be understood that one of these rack and pinion devices is used to operate each one of the several instruments which are mounted on the panel and, since they are all alike, a description of one will suffice for all.

A tension spring 31 connects a pin 32 projecting from the side of the bar 26 with a hook suspended from the upper wall of the cabinet, so that the normal action of said spring is to elevate the bar 26 to its uppermost position, such elevation being attended by the turning of the pinion 25 and the instrument operated thereby to what may be termed its zero position.

The bars 26 are each in vertical alignment with the axis of the shaft 7 above referred to, and the discs 8 are adjusted along said shaft so that one of the screws 16 will also be in vertical alignment with the head of the corresponding bar 26.

With the shaft 7 locked in such position, the knurled heads of the several adjusting devices may be turned to adjust the respective screws 16 out from or into the several flanges 15, with resulting adjustment of each particular device to which the respective bar 26 is connected, and each of these adjusting screws will be manipulated to bring in a particular broadcasting station, and, when so brought in, the crank 14 may be turned one revolution to bring the next line of adjusting screws into alignment with the several bars 26, when these adjusting screws may be adjusted in the same manner to bring in the second station, and so on until the entire number of twelve stations are brought in.

If it is desired to return to any one of the stations in order to listen to the program being broadcasted thereby, it is only necessary to turn the crank 14 until the particular station indicated is brought under the index pointer 23 and the several bars 26 permitted to come in contact with the extreme point of the several adjusting screws 16 which have previously been properly adjusted to bring in that particular station.

Unless some provision is made to clear the adjusting devices before turning the crank 14, and with it the shaft 7, it is obvious that the several adjusting screws 16 will interfere with the heads of the bars 26, for the reason that the springs 31 will immediately project their respective bars upwardly when the several screws 16 are turned out of alignment therewith.

As a clearing device, in the bottom of the cabinet is a bar 33, pivotally secured in the ends of the cabinet at 34 and 35 and extending forward so that the middle section of the bar is substantially parallel with the inner face of the panel 24.

At the middle of the bar 33 is a rigidly connected lever 36, pivoted in a bracket 37 at the bottom of the cabinet and projecting through a slot 38 upon the lower front of the panel.

Each of the bars 26 has its extreme lower end bent inwardly at right angles, as at 39, so as to lie in the path of the lower edge of the bar 33. A coil spring 40 connects the lever 36 with the top wall of the cabinet to normally hold the bar 33 elevated and out of contact with any one of the projections 39, even in their extreme uppermost positions.

At the right end of the device is a vertically slidable bar 41, projecting through the top of the cabinet and guided in a slot in the plate 6 along the inner face of the standard 3. Its upper end is off-set and provided with a single tooth 42, which engages a single groove in the periphery of a disc 43 mounted upon the shaft 11.

A pin 44 projects from the side of the bar, from which the coil spring 45 extends to a hook 46 in the upper wall of the cabinet, the tendency of said spring being to hold the tooth 42 in engagement with the groove and thus lock the shaft against rotation.

The lower end of the bar 41 is provided with a hook 47 in position to be engaged by the radial arm of the bar 33 when said bar is depressed. From this construction, it will be noted that the shaft 11 will be locked against rotating until such time as the lever 36 is depressed by hand, and that such depression will simultaneously carry with it all of the vertical sliding bars 26, thereby clearing all of the heads of said bars from engagement with the entire line of the adjusting screws 16; and at the same time the locking tooth 42 is disengaged from the disc 43.

The shaft 11 may now be rotated to bring any one of the broadcasting stations indicated upon the drum 21 adjacent to the index pointer 23, after which the lever 36 may be released so that each of the bars 26 will be elevated by its spring 31 until the heads of the several bars engage the points of the respective adjusted screws 16. Simultaneously the tooth 42 will engage the groove in the disc 43 and thus lock the shaft 7 in place.

Figure 5:
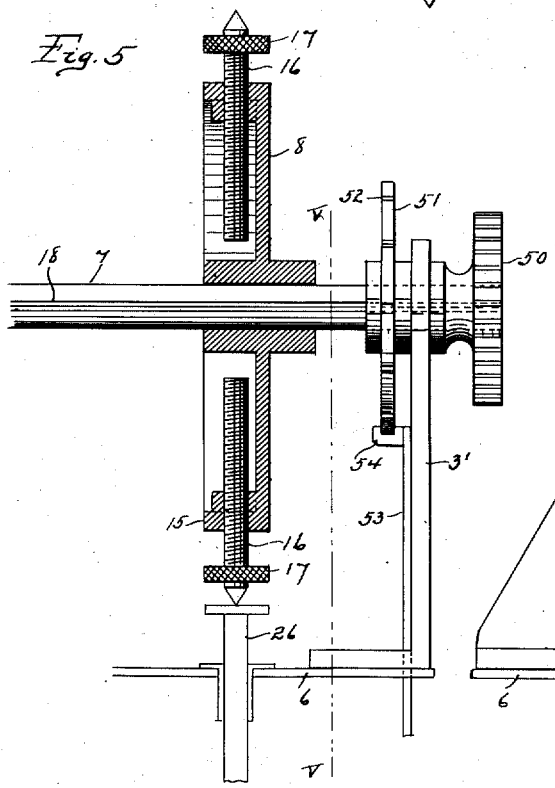
Fig. 5 is a fractional elevational view of the end of a finder, showing a modified form of adjustment.
Figure 6:
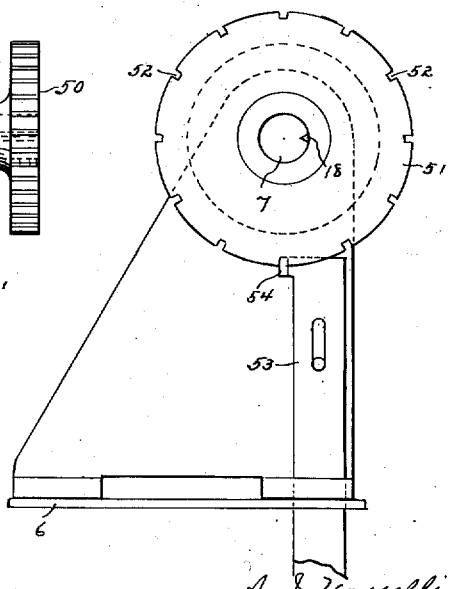
Fig. 6 is a sectional view, taken on line V—V of Fig. 5.

In Figs. 5 and 6, a slightly modified setting mechanism is shown, the rest of the devices remaining the same as above described. In this case the shaft 7, having mounted thereon the plurality of disc wheels 8, projects through the end standard 3′ and has secured at its outer end a turning knob 50.

On the inside of the standard 3′ is an index disc 51, rigidly secured upon the shaft 7 and having in its periphery a plurality of slots 52, there being as many of such slots as there are adjusting screws 16 in the discs 8. A vertically slidable locking bar 53, corresponding with the bar 41 above described, has off-set tooth 54 in vertical alignment with the axis of the shaft 7, and in position to engage the grooves 52 as the shaft 7 and disc 51 are turned by the knob 50.

Figure 2:
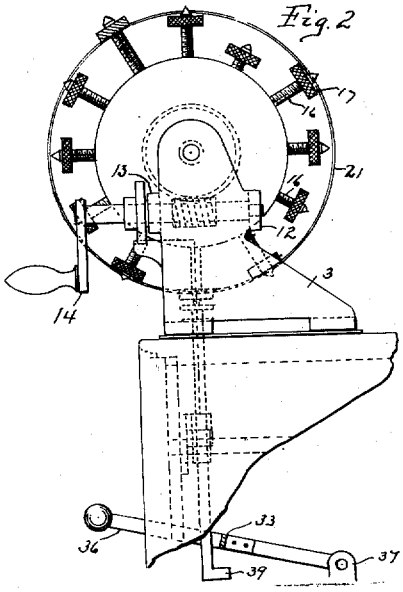
Fig. 2 is a right hand end elevational view of the same.
Figure 3:
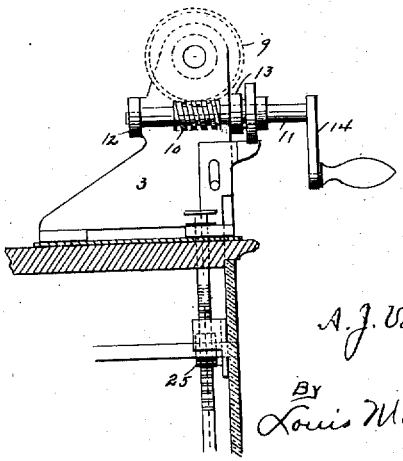
Fig. 3 is a sectional view taken on line I—I of Fig. 1.
Figure 4:
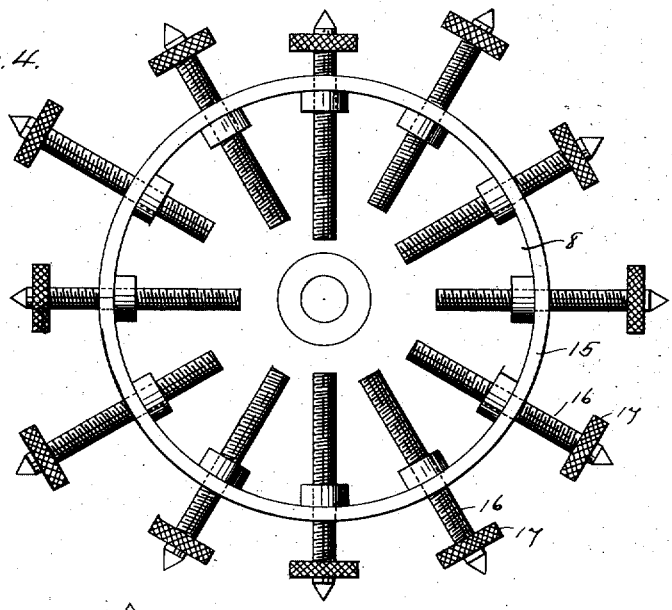
Fig. 4 is an enlarged side elevational view, of one of the adjusting wheels.

All of the other mechanisms being the same as that described in connection with Figs. 1, 2, and 3, it is obvious that upon depressing the lever 36 the several operating bars 26 will be simultaneously depressed, as will also the bar 53 with its locking tooth 54 to unlock the shaft 7. The knob 50 may then be turned to bring any particular station into registry with the index pointer 23, whereupon the lever 36 will be released, permitting the several operating bars 26 to be elevated by their respective springs 31, and also the elevation of the locking bar 53 to bring its tooth 54 into engagement with the corresponding slot in the index disc 51, thereby locking the entire mechanism in its changed position for bringing in any desired station. The mechanism just described affords a quick and convenient means for turning the shaft 7 to any station indicated upon the drum 21.

While the discs 8 are shown as provided with twelve adjusting screws 16, it is obvious that additional screws could be inserted in the flanges 15, so as to provide for a larger number of stations. The drawing also shows six of such disc wheels 8 mounted upon the shaft 7 in Fig. 1, but the number of such discs may be increased or diminished as the number of instruments within the cabinet are increased or diminished. As above indicated, the entire set of adjusting screws 16 may be adjusted for any series of broadcasting stations, so that the shaft 7 may be turned to bring in any one of such stations.

It often happens that atmospheric or static conditions are such as to make a further small adjustment of some one of the several instruments in the receiving set desirable in order to obtain the best results, and this may be readily done by turning slightly one or more of the knurled heads on the adjusting screws 16, all of which are exposed and in position for easy and ready manipulation.

Inasmuch as the adjusting screws 16 may be turned in either direction, it is obvious that accurate micrometric adjustments of any one of the several tuning instruments within the cabinet may be obtained, and, when properly adjusted, the device may be reset to bring in any particular station at a moment's notice, without having to readjust and manipulate the several turning knobs usually found upon a receiving set.

While I have shown two different forms of locking mechanisms for locking the operating shaft 7, yet I do not wish to be confined to these two forms alone, since other forms of locking mechanism would readily be suggested to those skilled in the art and would come within the scope of my invention. I therefore claim broadly the adjusting means whereby a plurality of operating instruments may be reset as often as desired and locked in said reset or readjustment positions. Mechanism embodying the principle of my invention may be adapted for use in other relation, and I claim broadly such adaptations of means embodying the principle of my invention.

I claim:—

1. In a radio station finder, in combination with the tuning instruments of a receiving station set, means including rack actuated devices for accurately and simultaneously resetting said instruments for receiving signals from any one of a plurality of broadcasting stations, said means including a plurality of individually adjustable screws, one for each station, a mount common to all of said screws, and means for rotating said mount to bring any selected screw into operative position with the racks actuating said devices.

2. In a radio station finder, in combination with the tuning instrument of a receiving set having an operating shaft, a pinion mounted upon said shaft, a vertically slidable spring actuated rack for rotating said shaft, and a plurality of adjusting screws, each capable of separate alignment with said rack, whereby the vertical reciprocation of said rack may be limited by said adjusting screws when separately and independently aligned with said rack.

3. In a radio station finder, the combination with the operating shaft of a tuning instrument for a radio receiving set, of a pinion upon said shaft, a reciprocating rack engaging said pinion, and a screw adjustable in alignment with the end of said rack for limiting the reciprocations thereof.

4. In a radio station finder, the combination with the operating shaft of a tuning instrument for radio receiving set, of a pinion mounted upon said shaft, a reciprocating rack engaging said pinion, a plurality of screws each independently adjustable in alignment with said rack, and means for shiftably supporting said screws to align any one of them with said rack, whereby its reciprocations and the corresponding rotation of said shaft may be limited in a predetermined manner.

5. In a radio station finder, the combination with a tuning instrument of a radio receiving set, and means for adjusting said instrument, of a plurality of adjusting devices associated with said means, each of said devices being capable of separate and independent adjustment, and means of shifting said devices respectively into engagement with said adjusting means, whereby said instrument may be reset at will to conform to predetermined adjustments respectively of said adjusting devices.

6. In a radio station finder, the combination with a tuning instrument of a radio receiving set, of a pinion mounted upon the operating shaft of said instrument, a reciprocating rack for rotating said pinion, a plurality of adjusting screws, and a shiftable support for said screws whereby each screw may be separately aligned with the end of said rack to limit its reciprocation to conform to a predetermined adjustment of said screws respectively.

7. In a radio station finder, the combination with the cabinet of a radio receiving set, and a tuning instrument enclosed therein, of a reciprocating bar for operating said instrument, a disc rotatably mounted upon said cabinet, and a plurality of adjusting screws located respectively in spaced relation on the periphery of said disc, whereby any one of said screws may be swung into alignment with the end of said rack to limit its reciprocation to conform to a predetermined adjustment of said screws respectively.

8. In a radio station finder, the combination with the cabinet of a radio receiving set, and a tuning instrument enclosed therein, of a reciprocating spring actuated bar for operating said instrument, said bar projecting through the top of said cabinet, a rotatable shaft supported upon said cabinet, a disc wheel mounted upon said shaft, and a plurality of adjusting screws carried at the periphery of said disc, each capable of separate alignment with the end of said rack, whereby the reciprocation of said rack may be limited to conform to the predetermined adjustment of said screws respectively.

9. In a radio station finder, the combination with a radio receiving cabinet, and a plurality of tuning instruments enclosed therein, of a plurality of reciprocating bars projecting through the top of said cabinet and each operatively connected with an instrument therein, a spring connected to each bar for elevating the same, a rotatable shaft supported upon said cabinet in alignment with said bars, a plurality of discs, each longitudinally adjustable along said shaft into alignment respectively with said bars, and a plurality of radially adjustable screws mounted in the periphery of each of said discs, whereby the rotation of said shaft will bring said screws successively into alignment with said bars and limit their vertical elevation to conform to predetermined adjustments of said screws.

10. In a radio station finder, the combination with a radio receiving cabinet, and a plurality of tuning instruments enclosed therein, of a plurality of reciprocating bars projecting through the top of said cabinet, each bar being operatively connected with an instrument therein, a spring connected to each bar for elevating the same, a rotatable shaft supported upon said cabinet in alignment with said bars, a plurality of discs, each longitudinally adjustable along said shaft into alignment respectively with said bars, a plurality of radially adjustable screws mounted in the periphery of each of said discs, whereby the rotation of said shaft will bring said screws successively into alignment with said bars and limit their vertical elevation to conform to predetermined adjustments of said screws, and means for simultaneously depressing all of said bars to permit the free rotation of said shaft without interference between said adjusting screws and the ends of said bars.

11. In a radio station finder, the combination with a radio receiving cabinet, and a plurality of tuning instruments enclosed therein, of a plurality of reciprocating bars projecting through the top of said cabinet and each operatively connected with an instrument therein, a spring connected to each bar for elevating the same, a rotatable shaft supported upon said cabinet in alignment with said bars, a plurality of discs, each longitudinally adjustable along said shaft into alignment respectively with said bars, a plurality of radially adjustable screws mounted in the periphery of each of said discs, whereby the rotation of said shaft will bring said screws successively into alignment with said bars and limit their vertical elevation to conform to predetermined adjustments of said screws, and means for locking said shaft against rotation.

12. In a radio station finder, the combination with a radio receiving cabinet, and a plurality of tuning instruments enclosed therein, of a plurality of reciprocating bars projecting through the top of said cabinet and each operatively connected with an instrument therein, a spring connected to each bar for elevating the same, a rotatable shaft supported upon said cabinet in alignment with said bars, a plurality of discs, each longitudinally adjustable along said shaft into alignment respectively with said bars, a plurality of radially adjustable screws mounted in the periphery of each of said discs, whereby the rotation of said shaft will bring said screws successively into alignment with said bars and limit their vertical elevation to conform to predetermined adjustments of said screws, means for locking said shaft against rotation, and means for simultaneously unlocking said shaft and depressing said bars to permit the free rotation of said discs without interference between said screws and bars.

13. In a radio station finder, the combination with the operating shaft of a tuning instrument for a radio receiving set, of a pinion mounted upon said shaft, a reciprocating rack engaging said pinion, an adjustable abutment, and a shiftable support for said abutment operating to move it into and from a position in which it acts upon said rack and determines the extent of its reciprocation.

14. In a radio station finder, the combination with the operating shaft of a tuning instrument for a radio receiving set, of a pinion mounted upon said shaft, a reciprocable rack engaging said pinion, means operating to move said rack and thereby effect the adjustment of said tuning instrument, and an adjustable abutment bodily movable into and from a position contacting with said rack, acting to adjustably determine the extent to which said rack may be moved by said means and thereby predetermine the degree to which the operation of said means may effect the adjustment of said tuning instrument.

15. In a radio station finder, the combination, with an adjusting instrument of a radio receiving set, of a shaft rotatable to adjust said instrument, a pinion secured upon said shaft, a reciprocably movable rack engaging said pinion, an adjustable abutment movable into and from a position to contact with said rack and determine the extent of its movement, and an operable support carrying said abutment; said support acting upon operation to bring said abutment into service to adjustably determine the movement of said rack and pinion, the rotation of said shaft, and the adjustment of said adjusting instrument.

16. In a radio station finder, the combination, with an adjusting instrument of a radio receiving set, of a shaft rotatable to adjust said instrument, a pinion secured upon said shaft, a reciprocable movable rack engaging said pinion, and a rack-actuating device free from connection with said rack and acting upon operation to engage said rack and effect its movement and the rotation of said pinion and said shaft.

17. In a radio station finder, the combination, with an adjusting instrument of a radio receiving set, of means acting upon operation to adjust said instrument, a plurality of adjusting devices associated with said means, each of said devices being capable of separate and independent adjustment, and means operable to shift said devices respectively into engagement with said adjusting means, whereby said instrument may be reset at will to conform to predetermined adjustments respectively of said adjusting devices.

18. In a radio station finder, the combination with the operating shaft of a tuning instrument for a radio receiving set, of a pinion mounted upon said shaft, a reciprocable rack engaging said pinion, means operating to move said rack and thereby effect the adjustment of said tuning instrument, and means bodily movable into and from a position contacting with said rack, acting to determine the extent to which said rack may be moved by said rack-moving means and thereby predetermine the degree to which the operation of said rack-moving means may effect the adjustment of said tuning instrument.

19. In a radio station finder, the combination with the operating shaft of a tuning instrument for a radio receiving set, of a pinion mounted upon said shaft, a reciprocable rack engaging said pinion, means operating to move said rack and thereby effect the adjustment of said tuning instrument, and a plurality of means selectively movable into a position contacting with said rack, each acting when in such position to determine the extent to which said rack may be moved by said rack-moving means and thereby individually predetermine the degree to which the operation of said rack-moving means may effect the adjustment of said tuning instrument.

20. In a radio station finder, the combination with the operating shaft of a tuning instrument for a radio receiving set, of a pinion mounted upon said shaft, a reciprocable rack engaging said pinion, a spring operating to move said rack and thereby effect the adjustment of said tuning instrument, and means bodily movable into and from a position contacting with said rack, acting to determine the extent to which said rack may be moved by said spring and thereby predetermine the degree to which the operation of said spring may effect the adjustment of said tuning instrument.

In witness whereof, I have hereunto subscribed my name.

ANTHONY J. VASSELLI.